United States Patent
Harari et al.

(10) Patent No.: US 11,751,388 B2
(45) Date of Patent: *Sep. 5, 2023

(54) 3-DIMENSIONAL NOR STRINGS WITH SEGMENTED SHARED SOURCE REGIONS

(71) Applicant: SunRise Memory Corporation, San Jose, CA (US)

(72) Inventors: Eli Harari, Saratoga, CA (US); Raul Adrian Cernea, Santa Clara, CA (US)

(73) Assignee: SunRise Memory Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/721,247

(22) Filed: Apr. 14, 2022

(65) Prior Publication Data

US 2022/0238545 A1 Jul. 28, 2022

Related U.S. Application Data

(60) Continuation of application No. 17/170,664, filed on Feb. 8, 2021, now Pat. No. 11,335,693, which is a
(Continued)

(51) Int. Cl.
*G11C 7/18* (2006.01)
*H10B 43/20* (2023.01)
(Continued)

(52) U.S. Cl.
CPC .............. *H10B 43/20* (2023.02); *G11C 7/18* (2013.01); *G11C 16/0466* (2013.01);
(Continued)

(58) Field of Classification Search
None
See application file for complete search history.

(56) References Cited

U.S. PATENT DOCUMENTS 4,213,139 A 7/1980 Rao
5,583,808 A 12/1996 Brahmbhatt
(Continued)

FOREIGN PATENT DOCUMENTS

JP 2000339978 A 12/2000
JP 2009206451 A1 9/2009
(Continued)

OTHER PUBLICATIONS

"EP Extended Search Report EP168690149.3", dated Oct. 18, 2019.
(Continued)

*Primary Examiner* — Tan T. Nguyen
(74) *Attorney, Agent, or Firm* — Edward C. Kwok; VLP Law Group LLP

(57) ABSTRACT

A NOR string includes a number of individually addressable thin-film storage transistors sharing a bit line, with the individually addressable thin-film transistors further grouped into a predetermined number of segments. In each segment, the thin-film storage transistors of the segment share a source line segment, which is electrically isolated from other source line segments in the other segments within the NOR string. The NOR string may be formed along an active strip of semiconductor layers provided above and parallel a surface of a semiconductor substrate, with each active strip including first and second semiconductor sublayers of a first conductivity and a third semiconductor sublayer of a second conductivity, wherein the shared bit line and each source line segment are formed in the first and second semiconductor sublayers, respectively.

12 Claims, 4 Drawing Sheets

Related U.S. Application Data continuation of application No. 16/792,808, filed on Feb. 17, 2020, now Pat. No. 10,950,616, which is a division of application No. 16/006,612, filed on Jun. 12, 2018, now Pat. No. 10,608,008.

(60) Provisional application No. 62/522,665, filed on Jun. 20, 2017.

(51) Int. Cl.
  *H03K 19/20* (2006.01)
  *H03K 19/1776* (2020.01)
  *G11C 16/04* (2006.01)
  *G11C 16/08* (2006.01)
  *G11C 16/24* (2006.01)
  *H01L 29/786* (2006.01)

(52) U.S. Cl.
  CPC .............. *G11C 16/08* (2013.01); *G11C 16/24* (2013.01); *H03K 19/1776* (2013.01); *H03K 19/20* (2013.01); *H01L 29/78696* (2013.01)

(56) References Cited

U.S. PATENT DOCUMENTS

| | | |
|---|---|---|
| 5,646,886 A | 7/1997 | Brahmbhatt |
| 5,656,842 A | 8/1997 | Iwamatsu |
| 5,768,192 A | 6/1998 | Eitan |
| 5,789,776 A | 8/1998 | Lancaster et al. |
| 5,880,993 A | 3/1999 | Kramer et al. |
| 5,915,167 A | 6/1999 | Leedy |
| 6,040,605 A | 3/2000 | Sano et al. |
| 6,107,133 A | 8/2000 | Furukawa |
| 6,118,171 A | 9/2000 | Davies et al. |
| 6,130,838 A | 10/2000 | Kim et al. |
| 6,314,046 B1 | 11/2001 | Kamiya et al. |
| 6,362,508 B1 | 3/2002 | Rasovaky et al. |
| 6,434,053 B1 | 8/2002 | Fujiwara |
| 6,580,124 B1 | 6/2003 | Cleeves et al. |
| 6,744,094 B2 | 6/2004 | Forbes |
| 6,774,458 B2 | 8/2004 | Fricke et al. |
| 6,873,004 B1 | 3/2005 | Han et al. |
| 6,881,994 B2 | 4/2005 | Lee et al. |
| 6,946,703 B2 | 9/2005 | Ryu et al. |
| 7,005,350 B2 | 2/2006 | Walker et al. |
| 7,223,653 B2 | 5/2007 | Cheng et al. |
| 7,307,308 B2 | 12/2007 | Lee |
| 7,489,002 B2 | 2/2009 | Forbes et al. |
| 7,524,725 B2 | 4/2009 | Chung |
| 7,542,348 B1 | 6/2009 | Kim |
| 7,612,411 B2 | 11/2009 | Walker |
| 7,804,145 B2 | 9/2010 | Shimizu et al. |
| 8,026,521 B1 | 9/2011 | Or-Bach et al. |
| 8,139,418 B2 | 3/2012 | Carman |
| 8,178,396 B2 | 5/2012 | Sinha et al. |
| 8,278,183 B2 | 10/2012 | Lerner |
| 8,395,942 B2 | 3/2013 | Samachisa et al. |
| 8,630,114 B2 | 1/2014 | Lue |
| 8,767,473 B2 | 7/2014 | Shim et al. |
| 8,848,425 B2 | 9/2014 | Schloss |
| 8,878,278 B2 | 11/2014 | Alsmeier et al. |
| 9,190,293 B2 | 11/2015 | Wang et al. |
| 9,202,694 B2 | 12/2015 | Konevecki et al. |
| 9,230,985 B1 | 1/2016 | Wu et al. |
| 9,412,752 B1 | 8/2016 | Yeh et al. |
| 9,455,268 B2 | 9/2016 | Oh et al. |
| 9,589,982 B1 | 3/2017 | Cheng et al. |
| 9,620,605 B2 | 4/2017 | Liang et al. |
| 9,633,944 B2 | 4/2017 | Kim |
| 9,842,651 B2 | 5/2017 | Harari |
| 9,748,172 B2 | 8/2017 | Takaki |
| 9,799,761 B2 | 10/2017 | Or-Bach et al. |
| 9,892,800 B2 | 2/2018 | Harari |
| 9,911,497 B1 | 3/2018 | Harari |
| 10,074,667 B1 | 9/2018 | Higashi |
| 10,096,364 B2 | 10/2018 | Harari |
| 10,121,553 B2 | 11/2018 | Harari |
| 10,157,780 B2 | 12/2018 | Wu et al. |
| 10,217,667 B2 | 2/2019 | Or-Bach et al. |
| 10,249,370 B2 | 4/2019 | Harari |
| 10,254,968 B1 | 4/2019 | Gazit et al. |
| 10,283,493 B1 | 5/2019 | Nishida |
| 10,319,696 B1 | 6/2019 | Nakano |
| 10,373,956 B2 | 8/2019 | Gupta et al. |
| 10,381,370 B2 | 8/2019 | Shin et al. |
| 10,381,378 B1 | 8/2019 | Harari |
| 10,395,737 B2 | 8/2019 | Harari |
| 10,431,596 B2 | 10/2019 | Herner et al. |
| 10,475,812 B2 | 11/2019 | Harari |
| 10,608,008 B2 | 3/2020 | Harari et al. |
| 10,608,011 B2 | 3/2020 | Harari et al. |
| 10,622,377 B2 | 4/2020 | Harari et al. |
| 10,651,153 B2 | 5/2020 | Fastow et al. |
| 10,692,837 B1 | 6/2020 | Nguyen et al. |
| 10,692,874 B2 | 6/2020 | Harari et al. |
| 10,950,616 B2 | 3/2021 | Harari et al. |
| 11,309,331 B2 * | 4/2022 | Harari ............... H01L 21/76802 |
| 11,335,693 B2 * | 5/2022 | Harari ............... H01L 27/11578 |
| 2001/0030340 A1 | 10/2001 | Fujiwara |
| 2001/0053092 A1 | 12/2001 | Kosaka et al. |
| 2002/0012271 A1 | 1/2002 | Forbes |
| 2002/0028541 A1 | 3/2002 | Lee et al. |
| 2002/0051378 A1 | 5/2002 | Ohsawa |
| 2002/0109173 A1 | 8/2002 | Forbes et al. |
| 2002/0193484 A1 | 12/2002 | Albee |
| 2003/0038318 A1 | 2/2003 | Forbes |
| 2004/0207002 A1 | 10/2004 | Ryu et al. |
| 2004/0214387 A1 | 10/2004 | Madurawe et al. |
| 2004/0246807 A1 | 12/2004 | Lee |
| 2004/0262681 A1 | 12/2004 | Masuoka et al. |
| 2004/0262772 A1 | 12/2004 | Ramanathan et al. |
| 2004/0264247 A1 | 12/2004 | Kim |
| 2005/0128815 A1 | 6/2005 | Ishikawa et al. |
| 2005/0218509 A1 | 10/2005 | Kipnis et al. |
| 2005/0280061 A1 | 12/2005 | Lee |
| 2006/0001083 A1 | 1/2006 | Bhattacharyya |
| 2006/0140012 A1 | 6/2006 | Wan et al. |
| 2006/0155921 A1 | 7/2006 | Gorobets et al. |
| 2007/0045711 A1 | 3/2007 | Bhattacharyya |
| 2007/0134876 A1 | 6/2007 | Lai et al. |
| 2008/0178794 A1 | 7/2008 | Cho et al. |
| 2008/0239812 A1 | 10/2008 | Naofumi et al. |
| 2008/0291723 A1 | 11/2008 | Wang et al. |
| 2008/0301359 A1 | 12/2008 | Smith |
| 2009/0057722 A1 | 3/2009 | Masuoka et al. |
| 2009/0157946 A1 | 6/2009 | Arya |
| 2009/0237996 A1 | 9/2009 | Kirsch et al. |
| 2009/0242966 A1 | 10/2009 | Son et al. |
| 2009/0279360 A1 | 11/2009 | Peter et al. |
| 2009/0290442 A1 | 11/2009 | Rajan |
| 2009/0316487 A1 | 12/2009 | Lee et al. |
| 2010/0013001 A1 | 1/2010 | Cho et al. |
| 2010/0121994 A1 | 5/2010 | Kim et al. |
| 2010/0124116 A1 | 5/2010 | Takashi et al. |
| 2010/0128509 A1 | 5/2010 | Kim et al. |
| 2010/0213527 A1 | 8/2010 | Shim et al. |
| 2010/0219392 A1 | 9/2010 | Awaya et al. |
| 2010/0254191 A1 | 10/2010 | Son et al. |
| 2011/0044113 A1 | 2/2011 | Kim |
| 2011/0115011 A1 | 5/2011 | Masuoka et al. |
| 2011/0134705 A1 | 6/2011 | Jones et al. |
| 2011/0170266 A1 | 7/2011 | Haensh et al. |
| 2011/0170327 A1 | 7/2011 | Mazure et al. |
| 2011/0208905 A1 | 8/2011 | Shaeffer et al. |
| 2011/0291176 A1 | 12/2011 | Lee et al. |
| 2011/0298013 A1 | 12/2011 | Hwang et al. |
| 2011/0310683 A1 | 12/2011 | Gorobets |
| 2012/0063223 A1 | 3/2012 | Lee |
| 2012/0182801 A1 | 7/2012 | Lue |
| 2012/0243314 A1 | 9/2012 | Takashi |
| 2012/0248595 A1 | 10/2012 | Or-Bach et al. |
| 2012/0307568 A1 | 12/2012 | Banna et al. |
| 2013/0031325 A1 | 1/2013 | Nakamoto et al. |
| 2013/0256780 A1 | 10/2013 | Kai et al. |

(56) References Cited

U.S. PATENT DOCUMENTS

| | | |
|---|---|---|
| 2014/0015036 A1 | 1/2014 | Fursin et al. |
| 2014/0040698 A1 | 2/2014 | Loh et al. |
| 2014/0075135 A1 | 3/2014 | Choi et al. |
| 2014/0117366 A1 | 5/2014 | Saitoh |
| 2014/0151774 A1 | 6/2014 | Rhie |
| 2014/0229131 A1 | 8/2014 | Cohen et al. |
| 2014/0247674 A1 | 9/2014 | Karda et al. |
| 2014/0328128 A1 | 11/2014 | Louie et al. |
| 2014/0340952 A1 | 11/2014 | Ramaswamy et al. |
| 2015/0054507 A1 | 2/2015 | Gulaka et al. |
| 2015/0098272 A1 | 4/2015 | Kasolra et al. |
| 2015/0113214 A1 | 4/2015 | Sutardja |
| 2015/0155876 A1 | 6/2015 | Jayasena et al. |
| 2015/0194440 A1 | 7/2015 | Noh et al. |
| 2015/0249143 A1 | 9/2015 | Sano |
| 2015/0263005 A1 | 9/2015 | Zhao et al. |
| 2015/0372099 A1 | 12/2015 | Chen et al. |
| 2016/0013156 A1 | 1/2016 | Zhai et al. |
| 2016/0019951 A1 | 1/2016 | Park et al. |
| 2016/0035711 A1 | 2/2016 | Hu |
| 2016/0086970 A1 | 3/2016 | Peng |
| 2016/0225860 A1 | 8/2016 | Karda et al. |
| 2016/0300724 A1 | 10/2016 | Levy et al. |
| 2016/0314042 A1 | 10/2016 | Plants |
| 2017/0092370 A1 | 3/2017 | Harari |
| 2017/0092371 A1 | 3/2017 | Harari |
| 2017/0148517 A1 | 5/2017 | Harari |
| 2017/0148810 A1 | 5/2017 | Kai et al. |
| 2017/0213821 A1 | 7/2017 | Or-Bach et al. |
| 2017/0358594 A1 | 12/2017 | Lu et al. |
| 2018/0095127 A1 | 4/2018 | Pappu et al. |
| 2018/0108416 A1 | 4/2018 | Harari |
| 2018/0269229 A1 | 9/2018 | Or-Bach et al. |
| 2018/0331042 A1 | 11/2018 | Manusharow et al. |
| 2018/0366471 A1 | 12/2018 | Harari et al. |
| 2018/0366485 A1 | 12/2018 | Harari |
| 2018/0366489 A1 | 12/2018 | Harari et al. |
| 2019/0006009 A1 | 1/2019 | Harari |
| 2019/0019564 A1 | 1/2019 | Li et al. |
| 2019/0067327 A1 | 2/2019 | Herner et al. |
| 2019/0157296 A1 | 5/2019 | Harari et al. |
| 2019/0180821 A1 | 6/2019 | Harari |
| 2019/0206890 A1 | 7/2019 | Harari et al. |
| 2019/0214077 A1 | 7/2019 | Oh et al. |
| 2019/0237476 A1* | 8/2019 | Lee ..................... H10B 43/10 |
| 2019/0238134 A1 | 8/2019 | Lee et al. |
| 2019/0244971 A1 | 8/2019 | Harari |
| 2019/0259769 A1 | 8/2019 | Karda et al. |
| 2019/0303042 A1 | 10/2019 | Kim et al. |
| 2019/0325945 A1 | 10/2019 | Linus |
| 2019/0325964 A1 | 10/2019 | Harari |
| 2019/0319044 A1 | 11/2019 | Harari |
| 2019/0348424 A1 | 11/2019 | Karda et al. |
| 2019/0355747 A1 | 11/2019 | Herner et al. |
| 2019/0370117 A1 | 12/2019 | Fruchtman et al. |
| 2020/0051990 A1 | 2/2020 | Harari et al. |
| 2020/0098738 A1 | 3/2020 | Herner et al. |
| 2020/0098779 A1 | 3/2020 | Cernea et al. |
| 2020/0176468 A1 | 6/2020 | Herner et al. |
| 2020/0258897 A1 | 8/2020 | Yan et al. |
| 2020/0403002 A1 | 12/2020 | Harari |

FOREIGN PATENT DOCUMENTS

| | | |
|---|---|---|
| JP | 2010108522 A1 | 5/2010 |
| JP | 2010251572 A | 11/2010 |
| JP | 2011028540 A1 | 2/2011 |
| KR | 20120085591 A1 | 8/2012 |
| KR | 20120085603 A | 8/2012 |
| TW | 201624624 A | 7/2016 |
| WO | 2017053329 A1 | 3/2017 |
| WO | 2018236937 A1 | 12/2018 |

OTHER PUBLICATIONS

"European Search Report, EP 16852238.1", dated Mar. 28, 2019.
"European Search Report, EP17844550.8", dated Aug. 12, 2020, 11 pages.
"Invitation to Pay Additional Fees (PCT/ISA/206), PCT/US2020/015710", dated Mar. 20, 2020, 2 pages.
"Notification of Reasons for Refusal, Japanese Patent Application 2018-527740", (English translation), dated Nov. 4, 2020, 8 pages.
"Partial European Search Report EP 16869049.3", dated Jul. 1, 2019, pp. 1-12.
"PCT Search Report and Written Opinion, PCT/US2018/038373", dated Sep. 10, 2018.
"PCT Search Report and Written Opinion, PCT/US2019/014319", dated Apr. 15, 2019.
"PCT Search Report and Written Opinion, PCT/US2019/052164", dated Feb. 27, 2020.
"PCT Search Report and Written Opinion, PCT/US2019/052446", dated Dec. 11, 2019.
"PCT Search Report and Written Opinion, PCT/US2020/015710", dated Jun. 9, 2020.
"PCT Search Report and Written Opinion, PCT/US2020/017494", dated Jul. 20, 2020, 13 pages.
"PCT Search Report and Written Opinion, PCT/US2020/065374", dated Mar. 15, 2021, 17 pages.
"PCT Search Report and Written Opinion, PCT/US2020/065670", dated Apr. 5, 2021, 12 pages.
"PCT Search Report and Written Opinion, PCT/US2021/016964", dated Jun. 15, 2021, 19 pages.
"PCT Search Report and Written Opinion, PCT/US2021/025722", dated Jun. 15, 2021, 10 pages.
Hou, S. Y., et al., "Wafer-Leval Integration of an Advanced Logic-Memory System Through the Second-Generation CoWoS Technology", IEEE Transactions On Electron Devices, vol. 64, No. 10, Oct. 2017, 4071-4077.
Kim, N., et al., "Multi-layered Vertical gate NANO Flash Overcoming Stacking Limit for Terabit Density Storage", Symposium on VLSI Tech. Dig. of Technical Papers, 2009, pp. 188-189.
Lue, H.T., et al., "A Highly Scalable 8- Layer 3D Vertical-gate {VG} TFT NANO Flash Using Junction-Free Buried Channel BE-SONOS Device", Symposium on VLSI: Tech. Dig. Of Technical Papers, 2010, pp. 131-132.
Tanaka, T., et al., "A 768 Gb 3b/cell 3D-Floaling-Gate NANO Flash Memory", Digest of Technical Papers, the 2016 EEE International Solid-Slate Circuits Conference, 2016, pp. 142-144.
Wann, H.C., et al., "High-Endurance Ultra-Thin Tunnel Oxide in Monos Device Structure for Dynamic Memory Application", IEEE Electron Device letters, vol. 16, No. 11, Nov. 1995, pp. 491-493.

\* cited by examiner

3-DIMENSIONAL NOR STRINGS WITH SEGMENTED SHARED SOURCE REGIONS

CROSS REFERENCES TO RELATED APPLICATIONS

This application is a continuation of U.S. patent application ("Non-provisional application"), Ser. No. 17/170,664, entitled "3-Dimensional NOR Strings with Segmented Shared Source Regions," filed on Feb. 8, 2021, which is a continuation of U.S. patent application Ser. No. 16/792,808, entitled "3-Dimensional NOR Strings with Segmented Shared Source Regions," filed on Feb. 17, 2020, which is a divisional application of U.S. non-provisional application Ser. No. 16/006,612, entitled "3-Dimensional NOR Strings with Segmented Shared Source Regions," filed on Jun. 12, 2018, now U.S. Pat. No. 10,608,008, which is related to and claims priority of U.S. provisional patent application ("Provisional Application"), Ser. No. 62/522,665, entitled "3-Dimensional NOR Strings with Segmented Shared Source Regions," filed Jun. 20, 2017. This application is also related to copending U.S. patent application ("Copending Non-provisional application"), Ser. No. 15/248,420, entitled "Capacitive-Coupled Non-Volatile Thin-film Transistor Strings in Three-Dimensional Arrays," filed Aug. 26, 2016, and now published as U.S. 2017/0092371. The Provisional Application and the Copending Non-provisional application are hereby incorporated by reference in their entireties. References to the Copending Non-provisional application herein are made by paragraph numbers of the publication.

BACKGROUND OF THE INVENTION

1. Field of the Invention

The present invention relates to non-volatile NOR-type memory strings. In particular, the present invention relates to 3-dimensional semiconductor structures including arrays of non-volatile NOR-type memory strings.

2. Discussion of the Related Art

The Copending Non-provisional application discloses a 3-dimensional array of memory transistors organized as NOR strings in a semiconductor structure. Each such NOR strings includes a large number of individually addressable thin-film storage transistors ("TFTs") sharing a common or shared drain region and a common or shared source region, As discussed in paragraph [0159] of the Copending Non-provisional application, when a TFT in a NOR string is addressed and read, the cumulative off-state source-drain leakage current due to the large number of other TFTs (e.g., thousands) in the NOR string may interfere with the read current of the addressed TFT. To avoid such a large leakage current, one may consider having a shorter NOR string (i.e., a NOR string with fewer TFTs). However, for a given number of TFTs in an array of memory strings, a lesser number of TFTs in each NOR string results in a greater total number of sense amplifiers and string decoders required in the array, thereby increasing the chip cost.

SUMMARY

According to one embodiment of the present invention, a NOR string includes: a number of individually addressable thin-film storage transistors sharing a bit line, with the individually addressable thin-film transistors further grouped into a predetermined number of segments. In each segment, the thin-film storage transistors of the segment share a source line segment, which is electrically isolated from other source line segments in the other segments within the NOR string. The NOR string may be formed along an active strip of semiconductor layers provided above and parallel a surface of a semiconductor substrate, with each active strip including first and second semiconductor sublayers of a first conductivity and a third semiconductor sublayer of a second conductivity, wherein the shared bit line and each source line segment are formed in the first and second semiconductor sublayers, respectively.

A NOR string of the present invention may further include a conductive sublayer provided adjacent the first semiconductor sublayer to provide a low-resistivity path in the shared bit line, which may be selectively electrically connected to circuitry formed in the semiconductor substrate.

A NOR string of the present invention may be one of a number of like NOR strings formed one on top of another in a stack of active strips. The stack of active strips may, in turn, be part of a number of like stacks of active strips organized as an array of NOR strings.

Within each segment in a NOR string of the present invention, one or more pre-charge transistors may be provided to connect the shared bit line and the corresponding source line segment.

According to one embodiment of the present invention, a process for forming a memory structure includes: (i) forming circuitry in a semiconductor substrate, the semiconductor substrate having a planar surface; (ii) forming multiple active layers, with successive active layers being isolated from each other by isolation layers, each active layer comprising first and second semiconductor sublayers of a first conductivity type, a third semiconductor layer of a second conductivity type opposite the first conductivity type; (iii) patterning and etching the active layers anisotropically to form a first system of trenches from the top of the active layers along a first direction substantially perpendicular to the planar surface, such that each trench extends lengthwise along a second direction substantially parallel to the planar surface; (iv) filling the first set of trenches with a sacrificial material; (v) patterning and etching the sacrificial material anisotropically along the first direction to form a second set of trenches running lengthwise along a third direction substantially parallel the planar surface and substantially orthogonal to the second direction, thereby exposing a portion of each of the plurality of active layers; and (vi) isotropically etching the exposed portions of the active layers to remove exposed portions of the first, second and third semiconductor sublayers of each active layer.

In one embodiment, a process of the present invention provides, in each active layer, a conductive layer adjacent the first semiconductor sublayer that is resistant to the isotropically etching step.

Subsequent to the isotropically etching step, the process may further include: (i) selectively removing the sacrificial material from the first set of trenches to expose the active layers; (ii) providing a charge-trapping layer in trenches over the exposed active layers; (iii) filling the first of trenches with a conductive material; and (iv) patterning and anisotropically etching the conductive material to provide pillars of conductive material;

The present invention is better understood upon consideration of the detailed description below in conjunction with the accompanying drawings.

DETAILED DESCRIPTION OF THE PREFERRED EMBODIMENTS

Figure 1A:
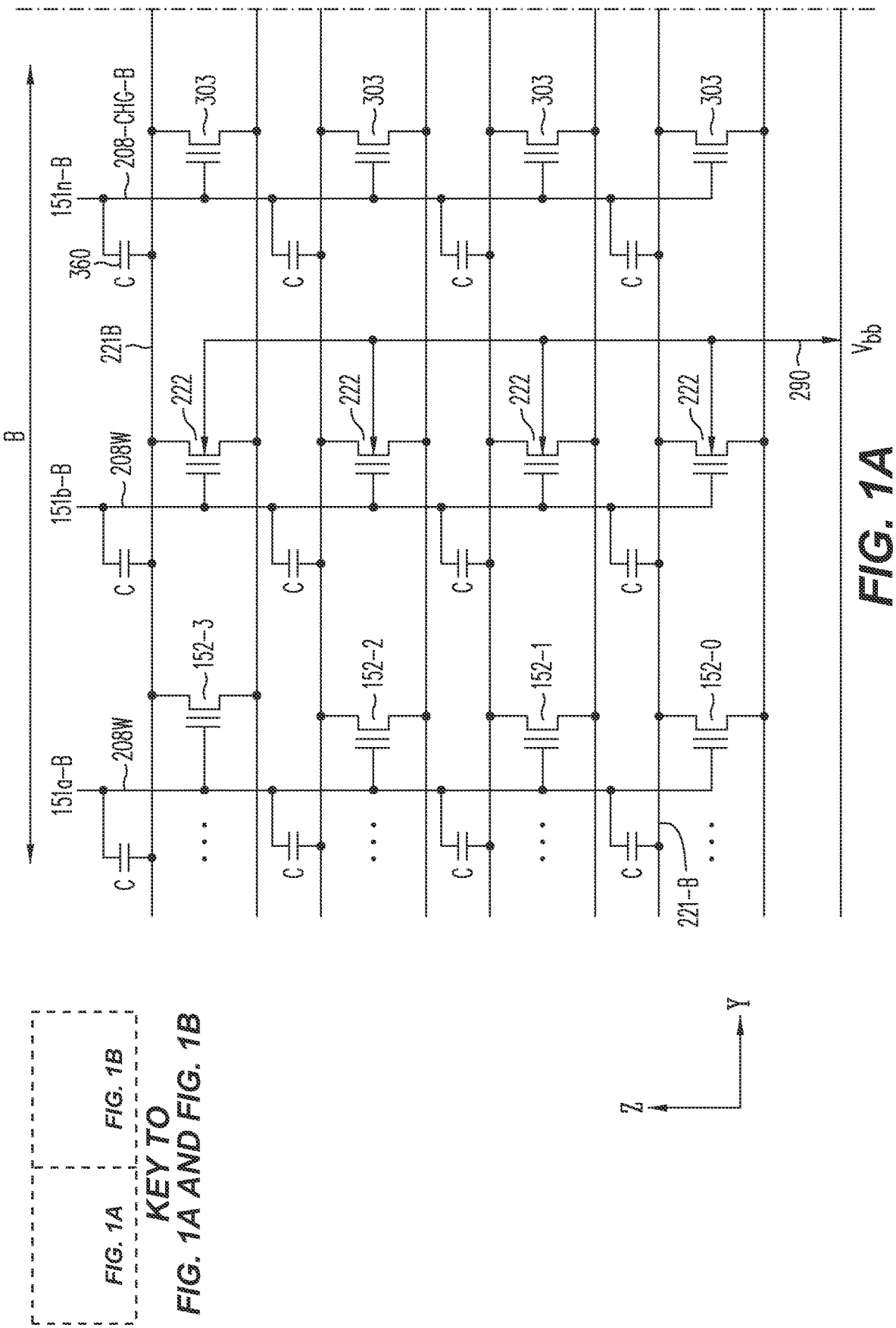
FIG. 1A and FIG. 1B (including the Key to FIGS. 1A and 1B) shows circuit schematic in which NOR strings 202-0, 202-1, 202-2 and 202-3 are formed in a stack, one on top of each other and separated from each other by insulator layers (not shown), in accordance with one embodiment of the present invention.
Figure 1B:
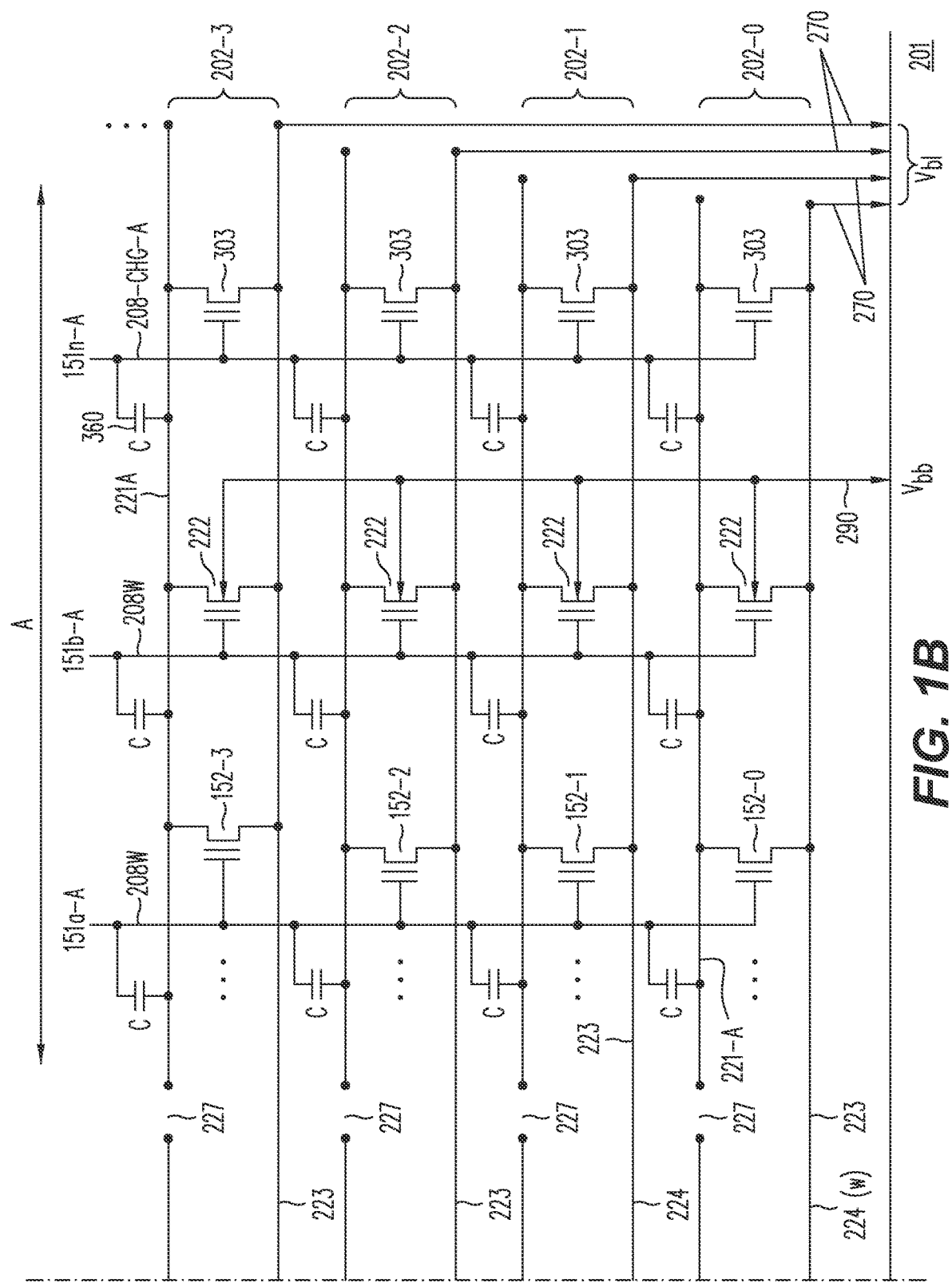

The present invention allows a memory array to be formed out of longer NOR strings, yet the memory array enjoys the benefits of a lesser leakage current as if it is formed out of much shorter NOR strings. FIG. 1 shows a circuit schematic in which NOR strings 202-0, 202-1, 202-2 and 202-3 are formed in a stack, one on top of each other and separated by an insulator (not shown), in accordance with one embodiment of the present invention. As shown in FIG. 1, each NOR string is provided a shared drain sublayer or bit-line 223 that is typically an N+ polysilicon layer that is preferably strapped by a narrow thin strip of low resistivity metallic interconnect 224 (e.g., Tungsten (W), Cobalt (Co) or another metallic material or a silicide). Each NOR string in FIG. 1 is also provided a shared source sublayer 221 (typically also N+ polysilicon), channel sublayer 222, typically p– polysilicon, and conductor word lines (e.g., word lines 151a and 151b). Of importance, shared bit-line sublayer 224 is continuous along the entire length of each NOR string, while electrical continuity in shared source sublayer 221 is interrupted at positions indicated by reference numeral 227, thereby dividing shared source sublayer 221 into a number of source line segments. Positions 227, where electrical connectivity in the shared source sublayer is interrupted, may be distributed at regular intervals. In some embodiments, as discussed in the Copending Non-provisional application, during reading, programming or erase operations, shared source sublayer 221 may be pre-charged from shared drain sublayer 223 through a TFT in the NOR string to a predetermined voltage. The voltage is then maintained by the parasitic capacitance as a virtual voltage source in shared source sublayer 223 during the remainder of the read, programming or erase operation.

In FIG. 1, positions 227 of NOR strings 202-0 to 202-3 are aligned, forming string segments A and B in each NOR string. Each such string segment may include, for example, 1,024 TFTs, so that eight string segments may be provided in a NOR string of 8,192 TFTs. All string segments in each NOR string are serviced by a single continuous, conducting shared bit-line 224. As shown in FIG. 1, each such string segment may incorporate pre-charge TFTs (e.g., pre-charge TFTs 208-CHG-A and 208-CHG-B). Such pre-charge TFTs may be a dedicated TFT in each string segment or alternatively, supplied by any TFT in the string segment. In these NOR strings, the pre-charge TFTs momentarily transfer the voltage on the bit line to their respective source line segment.

The segmented NOR string of the present invention is achieved by severing the source sublayer of each NOR string into individual source line segments, while retaining electrical continuity of the drain sublayer or bit line 224 sublayer along the entire length of the NOR string, spanning all string segments. Under such a scheme, during a read operation, only the source line segment that includes the addressed TFT contributes to the source-drain leakage current of the entire NOR string, while all other source line segments are pre-charged to the same voltage as that of the bit line, thereby eliminating their leakage current contributions. Although the segmentation requires an additional space to separate neighboring source line segments, the space can be a reasonably small area penalty. Another advantage of segmenting the source sublayer is achieved because the capacitance of each source line segment is correspondingly smaller than that of the full-string source capacitance, resulting in a lower power dissipation and a faster pre-charge.

Figure 2:
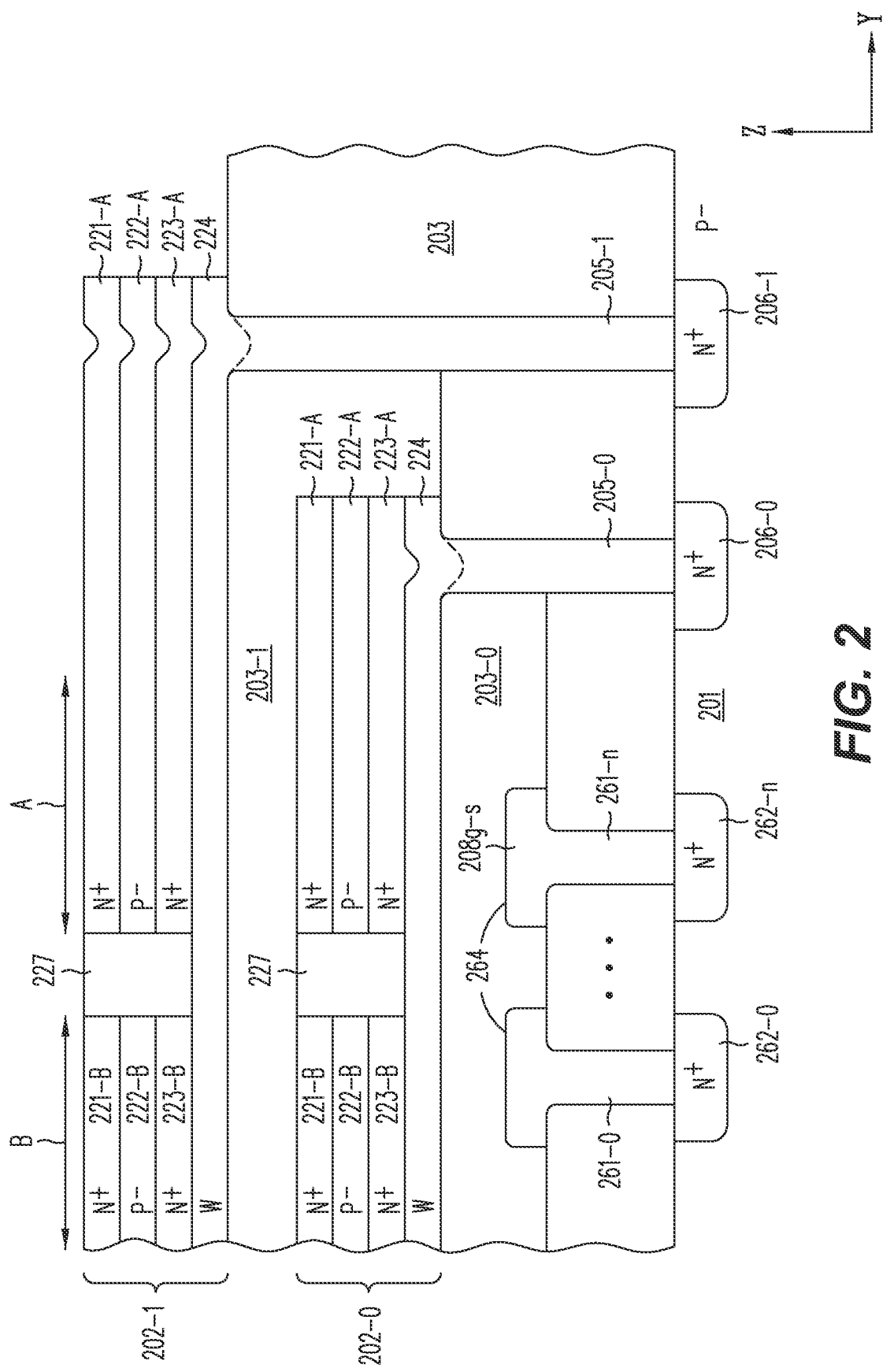
FIG. 2 shows a cross section of NOR strings 202-0 and 202-1 after a selective etch to create the source line segments, resulting in the two separate string segments A and B in each NOR string, in accordance with one embodiment of the present invention.

A selective-etch process may be applied to the NOR string structure to form the separations at positions 227 between adjacent source line segments. FIG. 2 shows a cross section of NOR strings 202-0 and 202-1 after the selective etch to create the source line segments, resulting in the two separate string segments A and B, in accordance with one embodiment of the present invention. The structure of FIG. 2 results from applying the selective etch on a variation of the structure shown in FIG. 2 of the Copending Non-provisional Application. (Unlike the structure shown in Copending Non-provisional Application, tungsten layer 224 is provided at the bottom—rather than the top—of the active layers forming NOR strings 202-1 and 202-2.)

As shown in FIG. 2, each of NOR strings 202-1 and 202-2 are formed out of stacked active layers, with each active layer including $N^+$ sublayer 221 (the common source sublayer), $P^-$ sublayer 222 (the channel sublayer), $N^+$ sublayer 223 (the common drain sublayer or bit line) and conducting layer 224 (e.g., tungsten). The selective-etching process cuts $N^+$ sublayer 221, $P^-$ sublayer 222, and $N^+$ sublayer 223, without etching into conducting layer 224. As conducting layer 224 is not etched, the segments 223-A and 223-B of $N^+$ sublayer 223 (i.e., the shared bit line) remains electrically connected.

FIG. 2 also shows that conductive layer 224 of each NOR string (e.g., NOR strings 202-0 and 202-1) are connected through respective buried contacts (e.g., buried contacts 205-0 and 205-1) to circuitry formed in semiconductor substrate 201. Such circuitry may include, for example, sense amplifiers and voltage sources. In addition, a system of global interconnect conductors 264 (e.g., global interconnect conductors 208g-s), which may be used to connect local word lines (not shown) along the NOR strings to circuitry in semiconductor substrate 201. As shown in FIG. 2, global interconnect conductors 208g-s are each connected by a buried contact (e.g., any of buried contact 261-0 to 261-n) to a corresponding (i.e., one of contacts 262-0 to 262-n) in semiconductor substrate 201.

Figure 3:
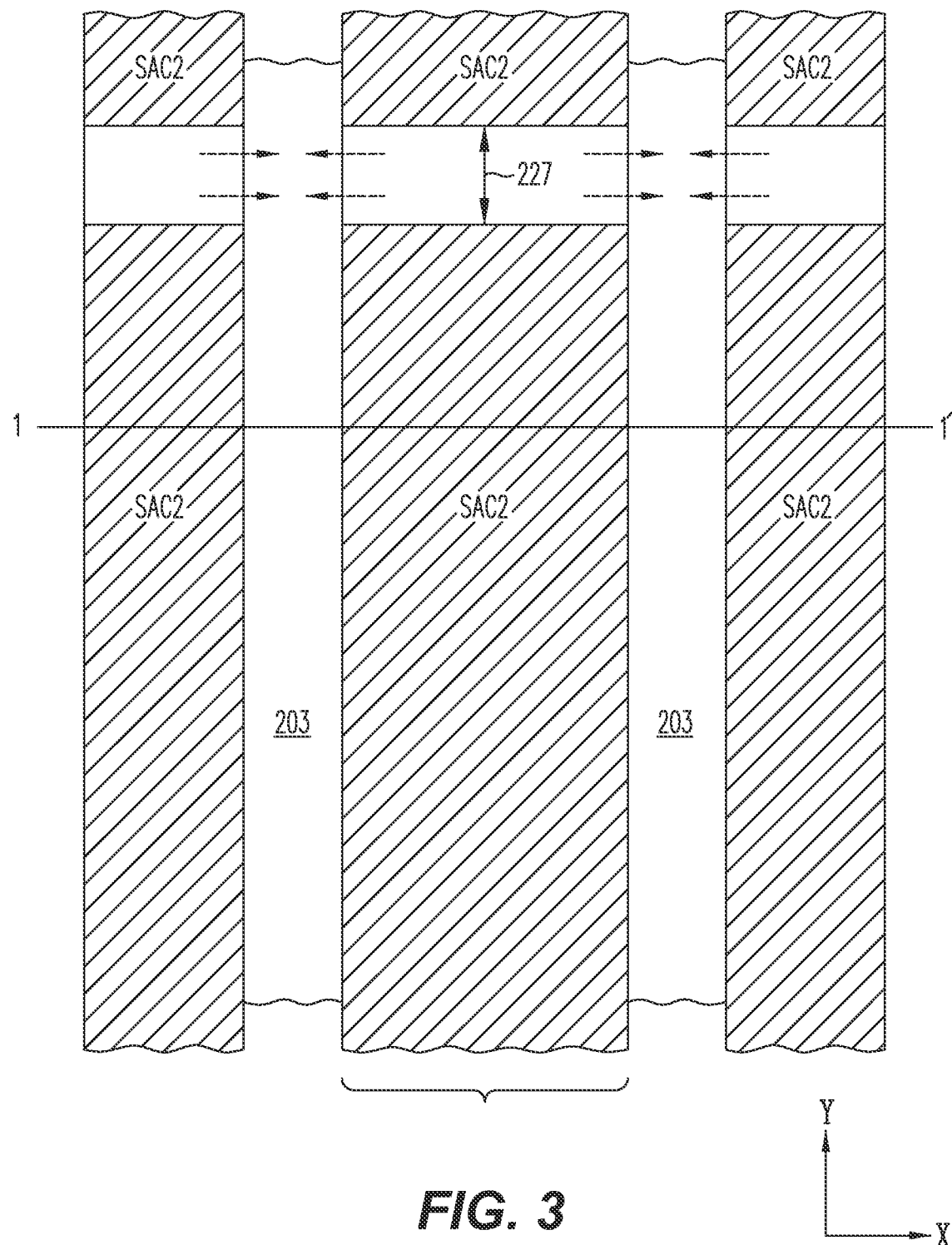
FIG. 3 illustrates a process that can be used to carry out a selective etch described herein, according to one embodiment of the present invention.

FIG. 3 illustrates a process that can perform the selective-etch described above. FIG. 3 is a top view of the NOR string array after the stacks of active layers are formed by patterning and anisotropically etching trenches running lengthwise along the Y-direction and in depth through the active layers. Initially, a number of active layers are formed, sublayer by sublayer, successively, with each active layer isolated from each other by an insulation layer. After the active layers are formed, insulator layer 203 is formed over the active layers. The resulting structure is then patterned and anisotropically etched. The resulting stacks of active layers that remain are the portions in FIG. 3 that are capped by insulation layer 203. The trenches are then filled using a sacrificial material SAC2, which may be, for example, a silicon oxide. A second set of trenches running lengthwise along the X-direction of width indicated in FIG. 3 by reference numeral 227 are etched all the way down the SAC2 material, thereby exposing the side edges of sublayers 221, 222, 223 and 224. A selective-etch then etches away the exposed semiconductor sublayers 221, 222, and 223, while leaving essentially in-tact conductive sublayers 224. Thereafter, the second set of trenches may be subsequently filled with an insulator, if desired. Sacrificial material SAC2 may then be selectively removed. Storage material (e.g., charge-trapping material) and local word line conductors are subsequently provided in these trenches resulting from removal of the SAC2 material.

The detailed description above is provided to illustrate specific embodiments of the present invention and is not intended to be limiting. Numerous variations and modifications within the scope of the present invention are possible. The present invention is set forth by the accompanying claims.

We claim:

1. An array of NOR memory strings, formed above a planar surface of a semiconductor substrate, the memory array comprising:
   a channel layer extending lengthwise along a first direction that substantially parallels the planar surface;
   a source layer and a drain layer each being in contact with the channel layer but separated from each other, the source layer and the drain layer each extending lengthwise along the first direction, wherein (i) the source layer comprises a first segment and a second segment that are electrically isolated from each other, (ii) a first portion of the channel layer, the first segment of the source layer and the drain layer form storage transistors of a first one of the NOR memory strings, and a second portion of the channel layer, the second segment of the source layer and the drain layer form storage transistors of a second one of the NOR memory strings; and (iii) as to storage transistors in each NOR memory string, the drain layer provides a common bit line, and the corresponding segment of the source layer provides a common source line;
   a layer of storage material provided in a trench that runs lengthwise along the first direction through the drain layer, the source layer and the channel layer; and
   a plurality of conductors to serve as local word lines.

2. The array of claim 1, wherein the array is organized as a plurality of active strip and wherein the first and the second NOR strings form a first active strip.

3. The array of claim 2, further comprising a second active strip comprising a third NOR memory string and a fourth NOR memory string, configured substantially identically to the first active strip, with the first and second NOR memory strings configured substantially identical to the first and the second NOR memory strings, respectively.

4. The array of claim 3, wherein the first active strip is formed above the second active strip in a first stack of active strips.

5. The array of claim 4, wherein a second stack of active strips is formed configured substantially identical to the first stack of active strips, the first and the second stacks active strips being spaced apart from each other along a second direction that also substantially parallels the planar surface, but is substantially orthogonal to the first direction.

6. The array of claim 5, wherein the first and the second stacks of active strips are separated from each other by the trench, the trench running lengthwise along the first direction.

7. The array of claim 1, further comprising a conductive layer formed adjacent and in electrical contact with the drain layer.

8. The array of claim 1, further comprising a plurality of regions in a conductive layer, each conductive region being formed adjacent and in electrical contact with an associated one of the segments of the source layer.

9. The array of claim 1, wherein circuitry supporting operations of the NOR memory strings are formed in the semiconductor substrate or at the planar surface of the semiconductor substrate, and wherein the drain layer is electrically coupled to the circuitry.

10. The array of claim 1, wherein the first and second segments of the source layer are separated from each other by an insulation material provided in a trench running along the second direction.

11. The array of claim 1 further comprising a first pre-charge transistor and a second pre-charge transistor provided to electrically connect, respectively, the common bit line of the first NOR memory string with the common source line of the first NOR memory string, and the common bit line of the second NOR memory string with the common source line of the second NOR memory string.

12. The array of claim 1 wherein, during a read or programming operation on the first NOR memory string, the common bit line and the common source line of the second NOR memory string are held at substantially the same voltage.

* * * * *